(12) United States Patent
Shim et al.

(10) Patent No.: US 7,435,619 B2
(45) Date of Patent: Oct. 14, 2008

(54) METHOD OF FABRICATING A 3-D PACKAGE STACKING SYSTEM

(75) Inventors: Il Kwon Shim, Singapore (SG); Byung Joon Han, Singapore (SG); Seng Guan Chow, Singapore (SG)

(73) Assignee: Stats Chippac Ltd., Singapore (SG)

( * ) Notice: Subject to any disclaimer, the term of this patent is extended or adjusted under 35 U.S.C. 154(b) by 257 days.

(21) Appl. No.: 11/307,615

(22) Filed: Feb. 14, 2006

(65) Prior Publication Data

US 2007/0187826 A1 Aug. 16, 2007

(51) Int. Cl.
*H01L 21/00* (2006.01)
*H01L 23/02* (2006.01)
*H05K 7/00* (2006.01)

(52) U.S. Cl. .................. 438/107; 438/109; 438/127; 257/686; 257/724; 257/780; 361/735; 361/783; 361/790

(58) Field of Classification Search ................ None
See application file for complete search history.

(56) References Cited

U.S. PATENT DOCUMENTS

| | | | |
|---|---|---|---|
| 5,444,296 A | 8/1995 | Kaul et al. | |
| 5,579,207 A | 11/1996 | Hayden et al. | |
| 5,748,452 A | 5/1998 | Londa | |
| 5,844,315 A * | 12/1998 | Melton et al. ............... | 257/738 |
| 5,854,507 A | 12/1998 | Miremadi et al. | |
| 5,963,430 A | 10/1999 | Londa | |
| 5,982,633 A | 11/1999 | Jeansonne | |
| 6,083,775 A | 7/2000 | Huang et al. | |
| 6,101,100 A | 8/2000 | Londa | |
| 6,165,815 A | 12/2000 | Ball | |
| 6,242,932 B1 | 6/2001 | Hembree | |
| 6,529,027 B1 | 3/2003 | Akram et al. | |
| 6,555,917 B1 | 4/2003 | Heo | |
| 6,762,488 B2 * | 7/2004 | Maeda et al. ............... | 257/686 |
| 6,774,475 B2 * | 8/2004 | Blackshear et al. ......... | 257/686 |
| 6,828,665 B2 | 12/2004 | Pu et al. ..................... | 257/686 |
| 6,838,761 B2 | 1/2005 | Karnezos | |
| 6,861,288 B2 * | 3/2005 | Shim et al. .................. | 438/109 |
| 6,891,239 B2 | 5/2005 | Anderson et al. ........... | 257/414 |
| 6,916,683 B2 * | 7/2005 | Stephenson et al. ........ | 438/108 |
| 6,933,598 B2 | 8/2005 | Karnezos .................... | 257/686 |
| 7,057,269 B2 | 6/2006 | Karnezos | |
| 7,093,358 B2 | 8/2006 | Akram et al. | |
| 7,109,574 B2 | 9/2006 | Chiu et al. | |
| 7,119,427 B2 | 10/2006 | Kim | |
| 7,176,506 B2 * | 2/2007 | Beroz et al. ................. | 257/232 |
| 7,190,061 B2 | 3/2007 | Lee | |
| 7,355,274 B2 * | 4/2008 | Lim ........................... | 257/686 |

* cited by examiner

*Primary Examiner*—Alonzo Chambliss
(74) *Attorney, Agent, or Firm*—Mikio Ishimaru

(57) ABSTRACT

The present invention provides a system for 3D package stacking system, comprising providing a substrate, attaching a ball grid array package, in an inverted position, to the substrate, forming a lower package, the lower package having the ball grid array package and the substrate encapsulated by a molding compound and attaching a second integrated circuit package over the lower package.

20 Claims, 5 Drawing Sheets

US 7,435,619 B2

METHOD OF FABRICATING A 3-D PACKAGE STACKING SYSTEM

CROSS-REFERENCE TO RELATED APPLICATIONS

The present application contains subject matter related to a concurrently filed U.S. patent application Ser. No. 11/354,806, assigned to STATS ChipPAC Ltd.

The present application contains subject matter related to co-pending U.S. patent application Ser. No. 11/306,627, assigned to STATS ChipPAC Ltd.

The present application contains subject matter also related to co-pending U.S. patent application Ser. No. 11/326,211, assigned to STATS ChipPAC Ltd.

The present application contains subject matter also related to co-pending U.S. patent application Ser. No. 11/326,206, assigned to STATS ChipPAC Ltd.

TECHNICAL FIELD

The present invention relates generally to integrated circuit package systems, and more particularly to a system for stacking 3D package structures.

BACKGROUND ART

In the electronics industry, as products such as cell phones, camcorders and digital media players become smaller and smaller, increased miniaturization of integrated circuit (IC) or chip packages has become more and more critical. At the same time, higher performance and lower cost have become essential for new products.

In response to the demands for newer packaging, many innovative package designs have been conceived and brought to market. The multi-chip module has achieved a prominent role in reducing the board space used by modern electronics. However, multi-chip modules, whether vertically or horizontally arranged, can also present problems because they usually must be assembled before the component chips and chip connections can be tested. That is, because the electrical bond pads on a die are so small, it is difficult to test die before assembly onto a substrate. Thus, when die are mounted and connected individually, the die and connections can be tested individually, and only known-good-die ("KGD") that is free of defects is then assembled into larger circuits. A fabrication process that uses KGD is therefore more reliable and less prone to assembly defects introduced due to bad die. With conventional multi-chip modules, however, the die cannot be individually identified as KGD before final assembly, leading to KGD inefficiencies and assembly process yield problems.

A multi-chip module may include stacking multiple die in a package. Two of the common die stacking methods are: (a) larger lower die combined with a smaller upper die, and (b) so-called same-size die stacking. With the former, the die can be very close vertically because the electrical bond pads on the perimeter of the lower die extend beyond the edges of the smaller die on top. With same-size die stacking, the upper and lower die are spaced more vertically apart to provide sufficient clearance for the wire bonds to the lower die. As discussed, both these methods have inherent KGD and assembly process yield loss disadvantages since KGD cannot be used for fabricating these configurations.

Another previous design is package level stacking or package on package (POP). This concept includes stacking of two or more packages. KGD and assembly process yields are not an issue since each package can be tested prior to assembly, allowing KGD to be used in assembling the stack. But package level stacking can pose other problems. One problem is package-to-package assembly process difficulties caused by irregularities in the flatness/coplanarity of the lower package. Another problem results from the increased stiffness of the overall assembly, which can lead to reduced board level reliability. Still another problem can arise from poor heat dissipation from the upper package. Thus, despite the advantages of recent developments in semiconductor fabrication and packaging techniques, there is a continuing need for improved packaging methods, systems, and designs for increasing semiconductor die density in PCB assemblies.

Thus, a need still remains for an efficient 3D package stacking process. In view of the ever-increasing need to save costs and improve efficiencies, it is more and more critical that answers be found to these problems. Solutions to these problems have been long sought but prior developments have not taught or suggested any solutions and, thus, solutions to these problems have long eluded those skilled in the art.

DISCLOSURE OF THE INVENTION

The present invention provides a system for 3D Package stacking system, comprising providing a substrate, attaching a ball grid array package, in an inverted position, to the substrate, forming a lower package, the lower package having the ball grid array package and the substrate encapsulated by a molding compound and attaching a second integrated circuit package over the lower package.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
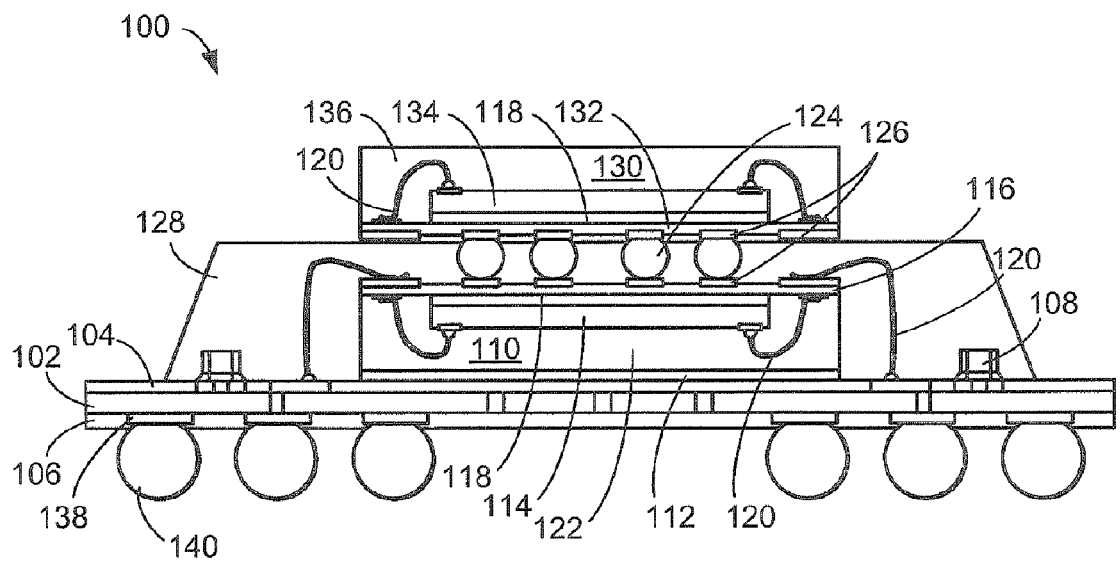
FIG. 1 is a cross-sectional view of a 3D package stacking system, in an embodiment of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the device are semi-diagrammatic and not to scale and, particularly, some of the dimensions are for the clarity of presentation and are shown greatly exaggerated in the drawing FIGs. In addition, where multiple embodiments are disclosed and described having some features in common, for clarity and ease of illustration, description, and comprehension thereof, the same numbers are used in all the drawing FIGs. to relate to the same elements.

The term "horizontal" as used herein is defined as a plane parallel to the conventional plane or surface of the attached die regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "processing" as used herein includes deposition of material or photoresist, patterning, exposure, development, etching, cleaning, and/or removal of the material or photoresist as required in forming a described structure.

Referring now to FIG. 1, therein is shown a cross-sectional view of a 3D package stacking system 100, in an embodiment of the present invention. The 3D package stacking system 100 includes a substrate 102, having a top substrate surface 104 and a bottom substrate surface 106, embedded components 108, such as filter capacitors, inductors, diodes, voltage regulators or resistors. The 3D package stacking system 100 also includes a first ball grid array package 110 mounted inverted, on the top substrate surface 104, utilizing an adhesive 112, such as die attach material, film adhesive or thermal epoxy. The first ball grid array package 110 can be electrically and functionally tested prior to assembly. The first ball grid array package 110 comprises a first integrated circuit 114 mounted on a first BGA interposer 116 with a die attach material 118. The first BGA interposer 116 may be assembled from a material such as glass epoxy laminate, flexible circuit tape, ceramic or resin coated metal alloy. Electrical interconnects 120, such as bond wires, electrically connect the first integrated circuit 114 to the first BGA interposer 116 and to the top substrate surface 104. The first integrated circuit 114, the electrical interconnects 120 and the die attach material 118 are encapsulated in a first molding compound 122. First interface interconnects 124, such as solder balls, stud bumps or solder column interposers, are attached to terminal pads 126.

A second molding compound 128 encapsulates the first ball grid array package 110, the embedded components 108, the electrical interconnects 120 and the top substrate surface 104. During the application of the second molding compound 128, a film assisted molding technique is used to leave the top surface of the first interface interconnects 124 exposed for further connection.

A second integrated circuit package 130 is electrically connected to the exposed array of the first interface interconnects 124. The second integrated circuit package 130 can be electrically and functionally tested prior to assembly. The second integrated circuit package 130 comprises a second BGA interposer 132, having a second integrated circuit 134 attached to the second BGA interposer 132 with the die attach material 118. The second BGA interposer 132 is assembled from a material such as glass epoxy laminate, flexible circuit tape, ceramic or resin coated metal alloy. The second integrated circuit 134 is electrically connected to the second BGA interposer 132 by the electrical interconnects 120.

A signal originating in the second integrated circuit 134 would propagate through the electrical interconnects 120, through the second BGA interposer 132, through the terminal pads 126 and the first interface interconnects 124. When the signal enters the first BGA interposer 116, it can either be routed to the first integrated circuit 114, to the substrate 102 or both. The signal path to the printed circuit board (not shown) is completed by substrate contacts 138 and second interface connections 140, such as solder balls, stud bumps or solder columns.

Figure 2:
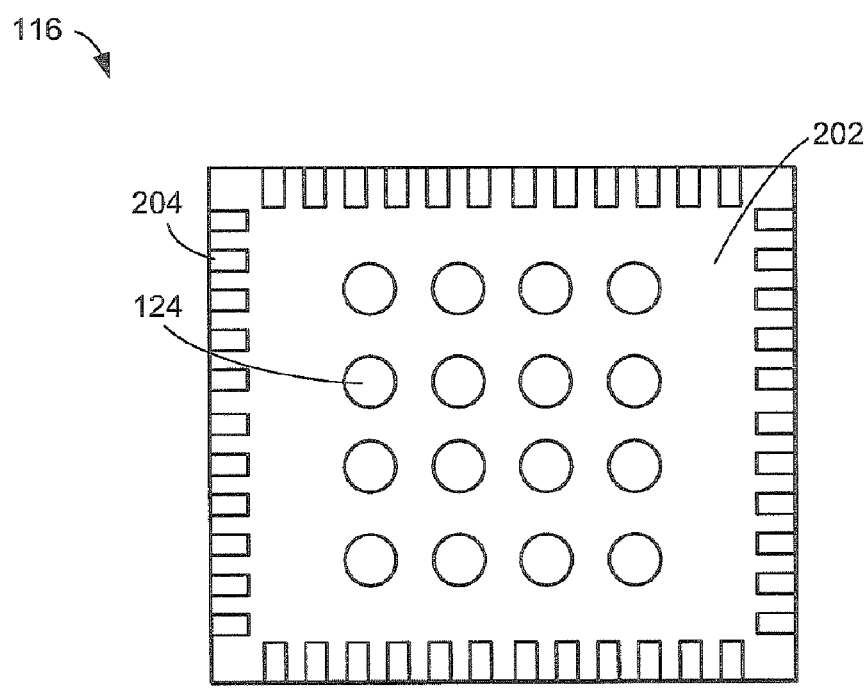
FIG. 2 is a bottom view of the first BGA interposer of FIG. 1.

Referring now to FIG. 2, therein is shown a bottom view of the first BGA interposer 116 of FIG. 1. The bottom view of the first BGA interposer 116 depicts the first interface interconnects 124 mounted on the terminal pads 126, of FIG. 1. An interposer substrate 202 supports bond fingers 204, the terminal pads 126 of FIG. 1 and the first interface interconnects 124. The interposer substrate 202 may be assembled from a material such as glass epoxy laminate, flexible circuit tape, ceramic or resin coated metal alloy. The array of the first interface interconnects 124 is shown for demonstration purposes. The actual number of elements in the array of the first interface interconnects 124 can be any number as required. Each of the bond fingers 204 is electrically connected to one or more of the first interface interconnects 124. The connections are made through substrate traces (not shown) or embedded wires (not shown) in the first BGA interposer 116.

Figure 3:
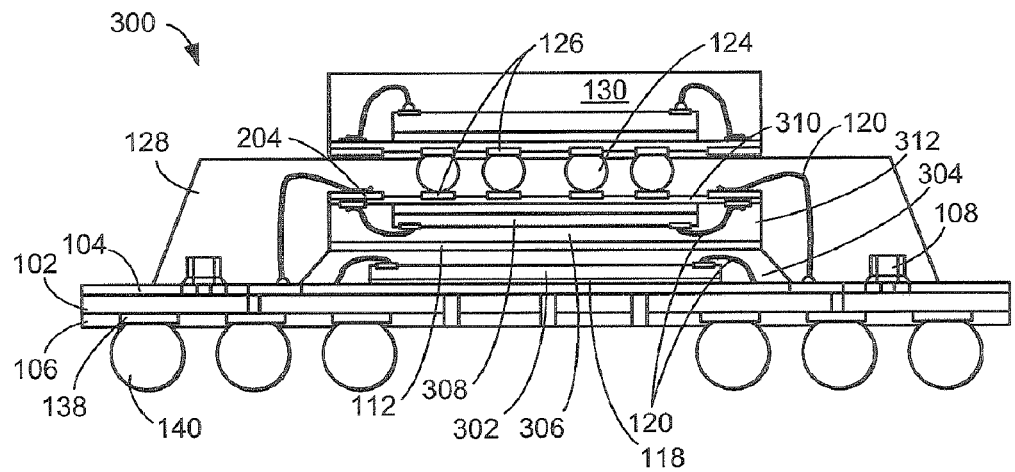
FIG. 3 is a cross-sectional view of a 3D package stacking system, in an alternative embodiment of the present invention.

Referring now to FIG. 3, therein is shown a cross-sectional view of a 3D package stacking system 300, in an alternative embodiment of the present invention. The 3D package stacking system 300 depicts the substrate 102 having the embedded components 108 electrically attached to the top substrate surface 104. A third integrated circuit 302 is mounted on the top substrate surface 104 with the die attach material 118. The electrical interconnects 120, such as bond wires, electrically connect the third integrated circuit 302 to the top substrate surface 104 for further interconnect. The third integrated circuit 302 can be electrically and functionally tested once it is mounted to the substrate 102. Once it is verified to be a KGD, the third integrated circuit 302 is encapsulated in a fourth molding compound 304 for further assembly.

A third ball grid array package 306 is inverted and mounted on the fourth molding compound 304 utilizing the adhesive 112. The third ball grid array package 306 is electrically and functionally tested prior to mounting. The third ball grid array package 306 comprises a fourth integrated circuit 308 mounted on a third BGA interposer 310 with the die attach material 118 encapsulated in a fifth molding compound 312. The electrical interconnects 120, such as bond wires, electrically connect the fourth integrated circuit 308 to the third BGA interposer 310 and to the top substrate surface 104. Any signal communication between the third integrated circuit 302 and the fourth integrated circuit 308 is through electrical connections (not shown) in the substrate 102.

The third BGA interposer 310 has the terminal pads 126, with the first interface interconnects 124 attached, and the bond fingers 204 electrically connected to the top substrate surface 104, by the electrical interconnects 120, such as bond wires. The second molding compound 128 encapsulates the third ball grid array package 306, the fourth molding compound 304, the electrical interconnects 120, the embedded components 108 and a portion of the top substrate surface 104. During the application of the second molding compound 128, a film assisted molding technique is used to leave the top surface, of the first interface interconnects 124, exposed for further connection. An additional BGA package, such as the second integrated circuit package 130, is electrically attached to the exposed portion of the first interface interconnects 124. In this example it is understood that the second integrated circuit package 130 is only an example and any compatible BGA package could be electrically connected to the first interface interconnects 124. The signal path to the printed circuit board (not shown) is through the substrate contacts 138 on the bottom substrate surface 106 and the second interface connections 140, such as solder balls, stud bumps or solder columns.

Figure 4:
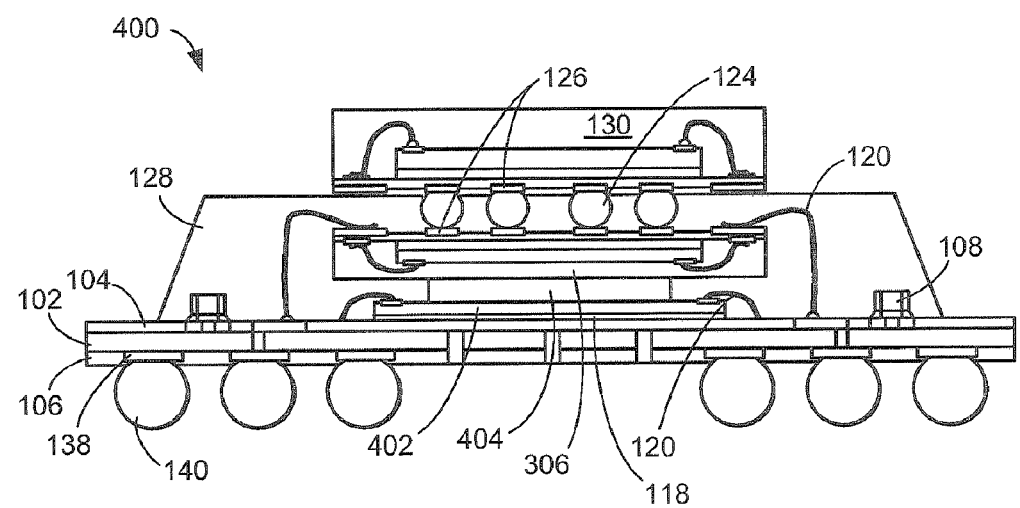
FIG. 4 is a cross-sectional view of a 3D package stacking system, in another alternative embodiment of the present invention.

Referring now to FIG. 4, therein is shown a cross-sectional view of a 3D package stacking system 400, in an alternative embodiment of the present invention. The 3D package stacking system 400 includes the substrate 102 having an integrated circuit die 402 attached to the top substrate surface 104 with the die attach material 118. The integrated circuit die 402 is electrically connected to the substrate 102 with the electrical interconnects 120, such as bond wires. The embedded components 108 are added to the top substrate surface 104, then the assembly is electrically and functionally tested in order to verify the KGD prior to further assembly.

An IC spacer 404 is applied to the integrated circuit die 402 in order to allow a clearance for the electrical interconnects 120. The third ball grid array package 306, or a different BGA package of similar construction, is inverted and attached to the IC spacer 404. The third ball grid array package 306 is electrically connected to the top substrate surface 104 with the electrical interconnects 120, such as bond wires. The first interface interconnects 124 are attached to the terminal pads 126 of the third ball grid array package 306.

The second molding compound 128 encapsulates the third ball grid array package 306, the integrated circuit die 402, the IC spacer 404, the electrical interconnects 120, the embedded components 108 and a portion of the top substrate surface 104. During the application of the second molding compound 128, a film assisted molding technique is used to leave the top surface, of the first interface interconnects 124, exposed for further connection. An additional BGA package, such as the second integrated circuit package 130, is electrically attached to the exposed portion of the first interface interconnects 124. In this example it is understood that the second integrated circuit package 130 is only an example and any compatible BGA package could be electrically connected to the first interface interconnects 124. The signal path to the printed circuit board (not shown) is through the substrate contacts 138 on the bottom substrate surface 106 and the second interface connections 140, such as solder balls, stud bumps or solder columns.

Figure 5:
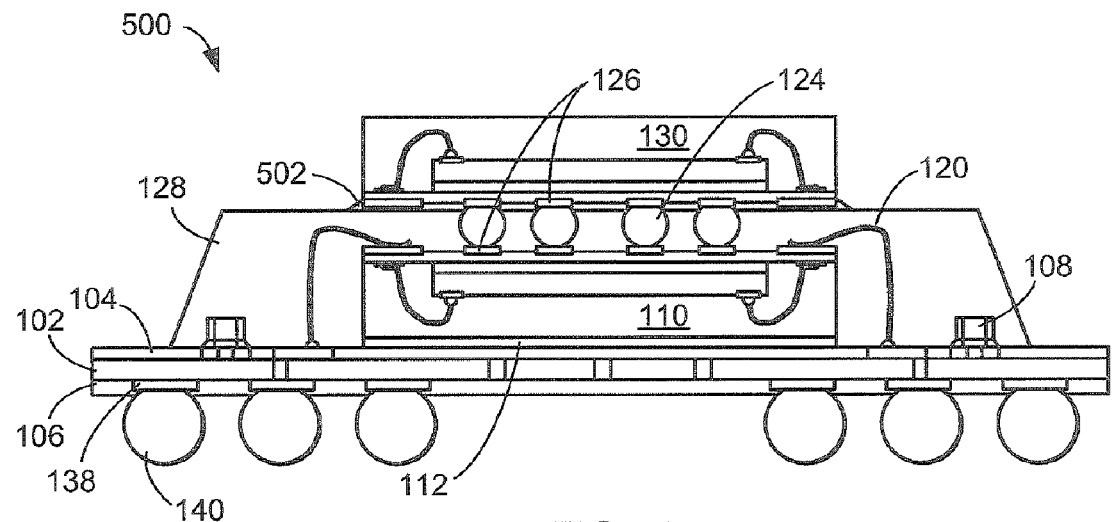
FIG. 5 is a cross-sectional view of a 3D package stacking system, in yet another alternative embodiment of the present invention.

Referring now to FIG. 5, therein is shown a cross-sectional view of a 3D package stacking system 500, in yet another alternative embodiment of the present invention. The 3D package stacking system 500 includes the substrate 102 having the first ball grid array package 110 inverted and attached to the top substrate surface 104 with the adhesive 112. The first ball grid array package 110 is electrically and functionally tested prior to assembly. The embedded components 108 are electrically attached to the top substrate surface 104, the electrical interconnects 120, such as bond wires, electrically connect the first ball grid array package 110 to the top substrate surface 104 and the first interface interconnects 124 are attached to the terminal pads 126 of the first ball grid array package 110.

The second molding compound 128 encapsulates the first ball grid array package 110, the electrical interconnects 120, the embedded components 108 and a portion of the top substrate surface 104. During the application of the second molding compound 128, a film assisted molding technique is used to leave the top surface, of the first interface interconnects 124, exposed for further connection.

An additional package, such as the second integrated circuit package 130, is electrically attached to the exposed portion of the first interface interconnects 124. In this example it is understood that the second integrated circuit package 130 is only an example and any compatible BGA package, land grid array package, leaded package, QFN package or direct chip attach could be electrically connected to the first interface interconnects 124.

An underfill material 502 is injected under the second integrated circuit package 130. The underfill material 502 is used to stabilize the second integrated circuit package 130 and remove stress from the first interface interconnects 124. The signal path to the printed circuit board (not shown) is through the substrate contacts 138 on the bottom substrate surface 106 and the second interface connections 140, such as solder balls, stud bumps or solder columns.

Figure 6:
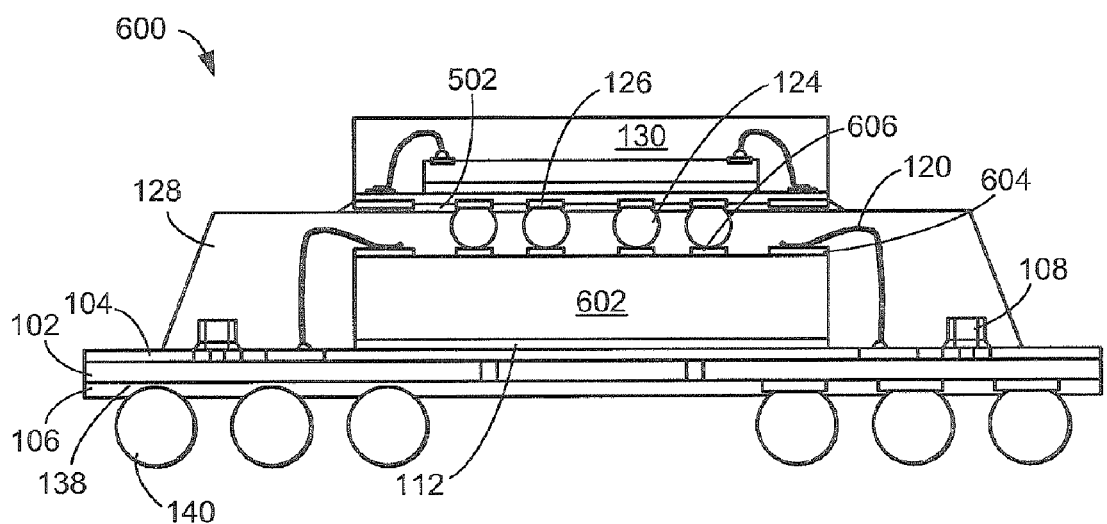
FIG. 6 is a cross-sectional view of a wafer level chip scale package, in an alternative embodiment of the 3D package stacking system of FIG. 1.

Referring now to FIG. 6, therein is shown a cross-sectional view of a wafer level chip scale package 600, in an alternative embodiment of the 3D package stacking system 100 of FIG. 1. The wafer level chip scale package 600 includes a redistributed line die 602 attached to the top substrate surface 104, of the substrate 102, with the adhesive 112. Contact pads 604 arranged around the periphery of the redistributed line die 602 are electrically connected to the top substrate surface 104 with the electrical interconnects 120. Bump pads 606 are arrayed in the interior space of the redistributed line die 602 and are attached to the first interface interconnects 124. The embedded components 108 are electrically connected to the top substrate surface 104 of the substrate 102 and the redistributed line die 602 is electrically and functionally tested prior to further assembly.

The second molding compound 128 encapsulates the redistributed line die 602, the embedded components 108, the electrical interconnects 120, the first interface interconnects 124 and a portion of the top substrate surface 104. During the application of the second molding compound 128, a film assisted molding technique is used to leave the top surface, of the first interface interconnects 124, exposed for further connection.

An additional package, such as the second integrated circuit package 130, is electrically attached to the exposed portion of the first interface interconnects 124. In this example it is understood that the second integrated circuit package 130 is only an example and any compatible BGA package, land grid array package, leaded package or direct chip attach could be electrically connected to the first interface interconnects 124.

The underfill material 502 is injected under the second integrated circuit package 130. The underfill material 502 is used to stabilize the second integrated circuit package 130 and remove stress from the first interface interconnects 124. The signal path to the printed circuit board (not shown) is through the substrate contacts 138 on the bottom substrate surface 106 and the second interface connections 140, such as solder balls, stud bumps or solder columns.

Figure 7:
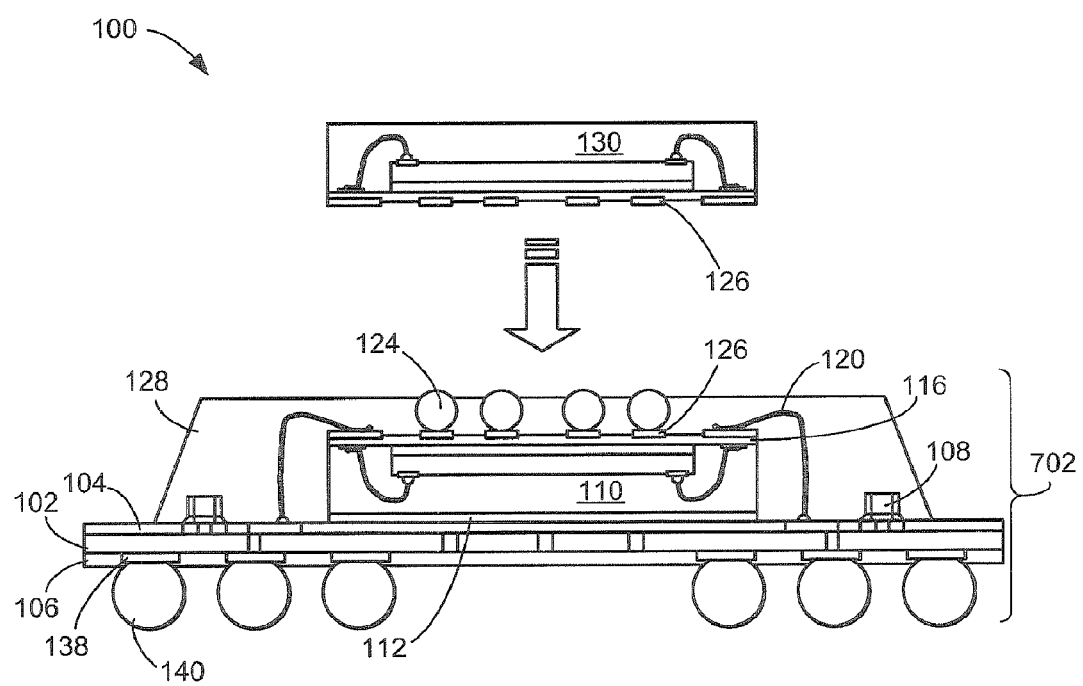
FIG. 7 is a cross-sectional view of the 3D package stacking system, in an intermediate stage of fabrication.

Referring now to FIG. 7, therein is shown a cross-sectional view of the 3D package stacking system 100, in an intermediate stage of fabrication. The 3D package stacking system 100 includes a lower package 702, such as a package in package, having the first ball grid array package 110 inverted and attached to the top substrate surface 104, of the substrate 102, with the adhesive 112. The electrical interconnects 120 connect the first ball grid array package 110 to the top substrate surface 104. The embedded components 108 are electrically connected to the top substrate surface 104 and the first interface interconnects 124 are attached to the terminal pads 126 of the first ball grid array package 110.

The second molding compound 128 encapsulates the first ball grid array package 110, the embedded components 108, the electrical interconnects 120 and partially the top substrate surface 104. During the application of the second molding compound 128, a film assisted molding technique is used to leave the top surface, of the first interface interconnects 124, exposed for further connection. An alternative process for exposing the first interface interconnects 124 is to use a chemical mechanical planarization process to cut down the top planar layer of the lower package 702. The first interface interconnects 124 that are exposed can be flattened to a planar surface by coining, pressing, polishing or lapping as well. Another option is that the first interface interconnects 124 can be flattened during the molding process. In order to facilitate this process, the material used for the first interface interconnects 124 would have to be characterized as having softness that the deformation in response to the mold chase clamping force would not cause the damage to the BGA interposer 116 or the mold chase (not shown).

An additional package, such as the second integrated circuit package 130, is electrically attached to the exposed portion of the first interface interconnects 124. In this example it is understood that the second integrated circuit package 130 is only an example and any compatible BGA package, land grid array package, leaded package, QFN package or direct chip attach could be electrically connected to the first interface interconnects 124.

Figure 8:
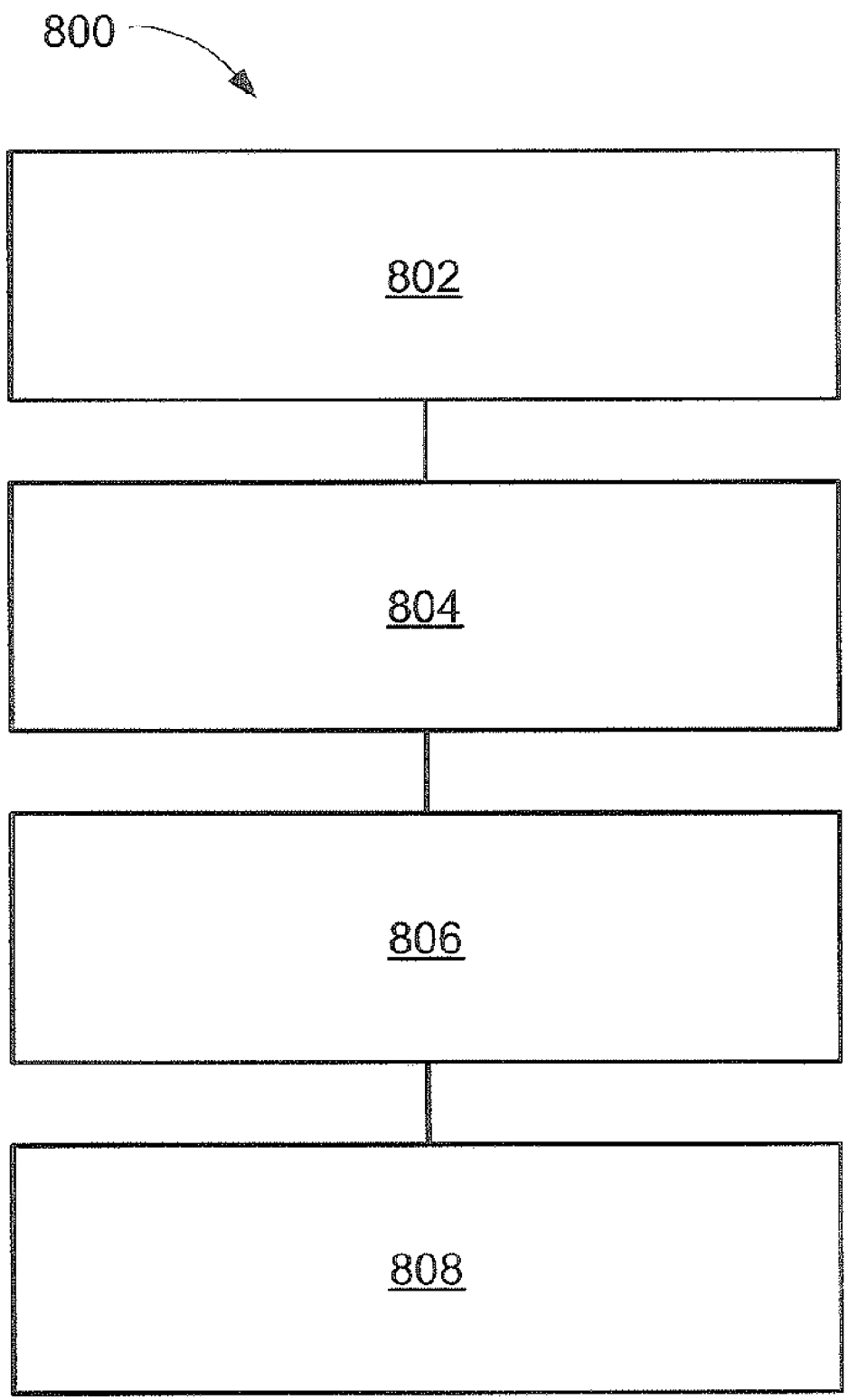
FIG. 8 is a flow chart of a system for 3D package stacking system in an embodiment of the present invention.

Referring now to FIG. 8, therein is shown a flow chart of a method for producing a 3D package stacking system 800 for 3D package stacking system 100 in an embodiment of the present invention. The system 800 includes providing a substrate in a block 802; attaching a ball grid array package, in an inverted position, to the substrate in a block 804; forming a lower package, the lower package having the ball grid array package and the substrate encapsulated by a molding compound in a block 806; and attaching a second integrated circuit package over the lower package in a block 808.

In greater detail, a method for fabricating a 3D package stacking system, in an embodiment of the present invention, is performed as follows:
1. Providing a substrate having embedded components electrically attached to a top substrate surface. (FIG. 1)
2. Attaching a ball grid array package, in an inverted position, to the substrate further comprises connecting a bond wire between the substrate and the ball grid array package. (FIG. 1)
3. Forming a lower package, the lower package having the ball grid array package and the substrate encapsulated by a molding compound, wherein solder balls of the ball grid array package protrude from the molding compound of the lower package. (FIG. 1)
4. Attaching a second integrated circuit package over the lower package further comprises providing a signal path through the lower package to a printed circuit board interface. (FIG. 1)

It has been discovered that the present invention thus has numerous aspects.

An aspect is that the present invention improves manufacturing yields due to the use of Known Good Die in the process. Another aspect is that the BGA interposer provides not only the design flexibility for the base assembly package but also the option of functional changes to the top module.

Yet another important aspect of the present invention is that it valuably supports and services the historical trend of reducing costs, simplifying systems, and increasing performance. These and other valuable aspects of the present invention consequently further the state of the technology to at least the next level.

Thus, it has been discovered that the 3D package stacking system method and apparatus of the present invention furnish important and heretofore unknown and unavailable solutions, capabilities, and functional aspects for 3D package optimization and cost reduction. The resulting processes and configurations are straightforward, cost-effective, uncomplicated, highly versatile and effective, can be implemented by adapting known technologies, and are thus readily suited for efficiently and economically manufacturing 3D package devices fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

What is claimed is:

1. A system for 3D package stacking system, comprising:
providing a substrate;
attaching a ball grid array package, in an inverted position, to the substrate;
forming a lower package, the lower package having the ball grid array package and the substrate encapsulated by a molding compound, wherein solder balls of the ball grid array package protrude from the molding compound of the lower package; and
attaching a second integrated circuit package over the lower package.

2. The system as claimed in claim 1 further comprising forming a BGA interposer in the ball grid array package.

3. The system as claimed in claim 1 further comprising attaching an encapsulated integrated circuit between the substrate and the ball grid array package within the lower package.

4. The system as claimed in claim 1 further comprising mounting an IC spacer over an integrated circuit die attached between the substrate and the ball grid array package.

5. The system as claimed in claim 1 further comprising applying an underfill material to stabilize the second integrated circuit package mounted over the lower package.

6. A 3D package stacking system, comprising:
providing a substrate having embedded components electrically attached to a top substrate surface;
attaching a ball grid array package, in an inverted position, to the substrate further comprises connecting a bond wire between the substrate and the ball grid array package;
forming a lower package, the lower package having the ball grid array package and the substrate encapsulated by a molding compound, wherein solder balls of the ball grid array package protrude from the molding compound of the lower package; and
attaching a second integrated circuit package over the lower package further comprises providing a signal path through the lower package to a printed circuit board interface.

7. The system as claimed in claim 6 further comprising forming a BGA interposer in the ball grid array package, wherein the BGA interposer establishes the connection pattern for the second integrated circuit package mounted over the lower package.

8. The system as claimed in claim 6 further comprising attaching an encapsulated integrated circuit between the substrate and the ball grid array package, wherein the encapsulated integrated circuit is electrically attached to the substrate and the ball grid array package.

9. The system as claimed in claim 6 further comprising utilizing an IC spacer over an integrated circuit die attached between the substrate and the ball grid array package, wherein the die is electrically attached to the substrate and the ball grid array package.

10. The system as claimed in claim 6 further comprising applying an underfill material to stabilize the second integrated circuit package mounted over the lower package.

11. A 3D package stacking system, comprising:
   a substrate;
   a ball grid array package, in an inverted position, attached to the substrate;
   a lower package comprising the ball grid array package and the substrate encapsulated by a molding compound, wherein solder balls of the ball grid array package protrude from the molding compound of the lower package; and
   a second integrated circuit package attached over the lower package.

12. The system as claimed in claim 11 further comprising a BGA interposer in the ball grid array package.

13. The system as claimed in claim 11 further comprising an encapsulated integrated circuit attached between the substrate and the ball grid array package.

14. The system as claimed in claim 11 further comprising an IC spacer mounted over an integrated circuit die attached between the substrate and the ball grid array package.

15. The system as claimed in claim 11 further comprising an underfill material to stabilize the second integrated circuit package mounted over the lower package.

16. The system as claimed in claim 11, wherein a substrate, a ball grid array package, in an inverted position, attached to the substrate, a lower package comprising the ball grid array package and the substrate encapsulated by a molding compound and a second integrated circuit package attached over the lower package;
   further comprising:
      embedded components electrically attached to a top substrate surface;
      a bond wire connected between the substrate and the ball grid array package; and
      a signal path for the second integrated circuit package through the lower package to a printed circuit board interface.

17. The system as claimed in claim 16 further comprising a BGA interposer in the ball grid array package, wherein the BGA interposer establishes the connection pattern for the second integrated circuit package mounted over the lower package.

18. The system as claimed in claim 16 further comprising an encapsulated integrated circuit attached between the substrate and the ball grid array package, wherein the encapsulated integrated circuit is electrically attached to the substrate and the ball grid array package.

19. The system as claimed in claim 16 further comprising an IC spacer, mounted over an integrated circuit die, attached between the substrate and the ball grid array package, wherein the die is electrically attached to the substrate and the ball grid array package.

20. The system as claimed in claim 16 further comprising an underfill material to stabilize the second integrated circuit package mounted over the lower package.

* * * * *